(12) United States Patent
Xu et al.

(10) Patent No.: US 11,705,908 B2
(45) Date of Patent: Jul. 18, 2023

(54) ON-CHIP SYNCHRONOUS SELF-REPAIRING SYSTEM BASED ON LOW-FREQUENCY REFERENCE SIGNAL

(71) Applicant: ZHEJIANG UNIVERSITY, Hangzhou (CN)

(72) Inventors: Zhiwei Xu, Hangzhou (CN); Shengjie Wang, Hangzhou (CN); Jiabing Liu, Hangzhou (CN); Liang Qiu, Hangzhou (CN); Yue Gong, Hangzhou (CN); Kailong Zhao, Hangzhou (CN); Chunyi Song, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 17/043,667

(22) PCT Filed: Apr. 9, 2020

(86) PCT No.: PCT/CN2020/084002
§ 371 (c)(1),
(2) Date: Sep. 30, 2020

(87) PCT Pub. No.: WO2020/207443
PCT Pub. Date: Oct. 15, 2020

(65) Prior Publication Data
US 2022/0052695 A1    Feb. 17, 2022

(30) Foreign Application Priority Data

Apr. 11, 2019    (CN) .................. 201910289884.X

(51) Int. Cl.
*H03L 7/07* (2006.01)
*G06F 15/78* (2006.01)
(Continued)

(52) U.S. Cl.
CPC ............ *H03L 7/07* (2013.01); *G06F 15/7825* (2013.01); *H03L 7/18* (2013.01); *H04L 7/0045* (2013.01); *H04L 7/0331* (2013.01)

(58) Field of Classification Search
CPC ......... H03L 7/07; H03L 7/18; G06F 15/7825; H04L 7/0045; H04L 7/0331
See application file for complete search history.

(56) References Cited

U.S. PATENT DOCUMENTS 9,225,507 B1 * 12/2015 Lye ..................... H04L 7/0331
10,243,573 B1    3/2019 Goyal et al.
(Continued)

FOREIGN PATENT DOCUMENTS

CN    103608694 A    2/2014
CN    104020453 A    9/2014
(Continued)

OTHER PUBLICATIONS

Machine Language Translation of JP2013-017067A (Year: 2013).*
(Continued)

*Primary Examiner* — Sophia Vlahos
(74) *Attorney, Agent, or Firm* — W&G Law Group

(57) ABSTRACT

The present disclosure discloses an on-chip synchronous self-repairing system based on a low-frequency reference signal. The system adopts a dual-input PLL stellate coupled structure or a dual-input PLL butterfly-shaped coupled structure, and delay of the whole loop is made to be an integral multiple of the reference signal by synchronizing the transmitted reference signal with the received reference signal, so as to ensure synchronization of local oscillation signal of each IC chip. The transmission wire based on an adjustable left-handed material is used as a delay wire to connect the dual-input PLL, thereby achieving low loss and reducing the physical distance of the delay wire. The system has the (Continued)

advantages of small area, low loss, strong adaptability and strict synchronization in various environments.

4 Claims, 3 Drawing Sheets

(51) Int. Cl.
   *H03L 7/18* (2006.01)
   *H04L 7/00* (2006.01)
   *H04L 7/033* (2006.01)

(56) References Cited

U.S. PATENT DOCUMENTS

| | | | | |
|---|---|---|---|---|
| 10,374,558 | B1* | 8/2019 | Kuo | H03F 3/195 |
| 2015/0381707 | A1* | 12/2015 | How | H04L 67/10 709/208 |
| 2017/0054491 | A1* | 2/2017 | Gallagher | H04B 17/18 |
| 2017/0163274 | A1 | 6/2017 | Cheng Chang et al. | |
| 2018/0351563 | A1 | 12/2018 | Allott et al. | |
| 2019/0319631 | A1* | 10/2019 | Buliga | H04B 7/0617 |

FOREIGN PATENT DOCUMENTS

| | | |
|---|---|---|
| CN | 105790760 A | 7/2016 |
| CN | 107251319 A | 10/2017 |
| CN | 109375182 A | 2/2019 |
| CN | 109379102 A | 2/2019 |
| CN | 110209625 A | 9/2019 |
| JP | 2013017067 A | 1/2013 |
| JP | 2013157654 A | 8/2013 |
| JP | 2015046799 A | 3/2015 |
| JP | 2015154486 A | 8/2015 |

OTHER PUBLICATIONS

Agrawal et al. "A scalable 28GHz coupled-PLL in 65nm CMOS with single-wire synchronization for large-scale 5G mm-wave arrays", Feb. 25, 2016, pp. 38-40, 2016 IEEE International Solid-State Circuits Conference (ISSCC).*

First Office Action (2020-558604); dated Nov. 29, 2021.

International Search Report (PCT/CN2020/084002); dated Jul. 8, 2020.

"Key technologies of wideband digital phased array for ocean surveillance" ((Oct. 28, 2017) [Yang, Lijie et al.].

* cited by examiner

ON-CHIP SYNCHRONOUS SELF-REPAIRING SYSTEM BASED ON LOW-FREQUENCY REFERENCE SIGNAL

TECHNICAL FIELD

The present disclosure relates to the field of radar phased arrays, and more particularly, to a synchronous self-repairing system for the phase of local oscillator signals among digital transceiver chips on array element tiles in a phased array.

BACKGROUND

In a large array, how to synchronize each array element is the key technology of a phased array. The use of an array requires strict synchronization. The phase difference between each array element of an analog array is fixed, while the phases of various array elements of a digital array are the same; a large digital phased array is usually composed of multiple array element tiles, and each array element tile contains several to dozens of digital transceiver chips. There are two kinds of synchronization requirements in the system: intra-tile synchronization and inter-tile synchronization. The change of the environment will lead to the failure of synchronization during installation, and there is a phase offset between the LO signals of multiple IC chips in the array tile. Such a static offset is undesirable for a phased array, and needs to be minimized to achieve the synchronization in the array tile.

In addition, it needs to make up the delay to an integer multiple of the period for a synchronization system. Because the wavelength of the low-frequency signal is too long (for example, the wavelength of the 10 MHz reference signal in the air is 30 meters), and the size of the array element tile is usually much smaller than 1 meter, it is unacceptable to use a low-frequency synchronization system to generate an equivalent delay wire as long as 30 meters.

SUMMARY

In view of the shortcomings of the prior art, the present disclosure proposes an on-chip synchronous self-repairing system coupled with a dual-input PLL based on an adjustable left-handed material transmission wire. The system is based on a low-frequency reference signal, and the whole synchronization system is connected into a stellate or butterfly-shaped structure. The IC chip synchronizes the transmitted reference signal with the received reference signal through a phase-locked loop. It is assumed that each array element tile can obtain a reference signal with the same phase, and on this basis, the local oscillator signal synchronization of each RF transceiver chip in the tile is guaranteed.

The technical solution adopted by the present disclosure to achieve the above purpose is as follows:

An on-chip synchronous self-repairing system based on a low-frequency reference signal, wherein the system adopts a dual-input PLL stellate coupled structure or a dual-input PLL butterfly-shaped coupled structure, and PLLs are coupled with each other via a single wire; the dual-input PLL stellate coupled structure connects n dual-input PLLs through chain closure, which mutually transmit one quarter of local oscillator signals for interlocking to achieve synchronization of the on-chip local oscillator signal; the dual-input PLL butterfly-shaped coupled structure connects m dual-input PLLs by lumping, and the local oscillator signals on each IC chip in a chip are synchronized by a given reference signal; where $n \geq 3$ and $m \geq 3$, and a transmission wire based on a left-handed material is used for interconnection between the dual-input PLLs.

Furthermore, the dual-input PLL stellate coupled structure has a dual-input PLL module in the IC chip, and each IC chip is sequentially interconnected through a common IO port, and an interconnection phase shift generated by the transmission wire is compensated by a DLL module; the dual-input PLL stellate coupled structure is constructed such that:

a common IO port of a dual-input PLL1 is connected to a common IO port of a dual-input PLL2, another common IO port of the dual-input PLL2 is connected to a common IO port of a dual-input PLL3, another common IO port of the dual-input PLL3 is connected to a common IO port of a dual-input PLL4, and so on; a common IO port of a dual-input PLLn−1 is connected to a common IO port of a dual-input PLLn, and another common IO port of the dual-input PLLn is connected to another common IO port of the dual-input PLL1, so as to form a closed loop.

Furthermore, for the dual-input PLL butterfly-shaped coupled structure, a LO and a PLL module are in the IC chip, and DLL modules are outside the IC chip, and are all connected together and lumped to transmit the given reference signal; and each IC chip is connected to the lumped DLL module through a common IO port; and the dual-input PLL butterfly-shaped coupled structure is constructed such that:

m DLLs of dual-input PLL1, PLL2 to PLLm are connected together and compensate for a transmission phase shift through the DLL module, and are lumped to transmit the given reference signal, and are sequentially connected to PLL1, PLL2 and PLLm through a common IO port, so that LO signals of all IC chip on the chip are synchronized.

Furthermore, the dual-input PLL includes an LC VCO oscillator, an injection locked 2-divider, a 4-divider, a single-wire coupling block 1 and a single-wire coupling block 2; phase detectors PD1 and PD2; drivers GM1, GM2, GM3, GM4, GM5, GM6, GM7 and GM8; buffers BUF1, BUF2, BUF3, BUF4, BUF5 and BUF6 and low-pass filters LPF1, LPF2 and LPF3, wherein the phase detector PD1 includes Mixer1 and Mixer2, and the phase detector PD2 includes mixers Mixer3 and Mixer4;

the dual-input PLL is connected in a such a manner that: the transmission wire connected to an port of the PLL is connected to an input port of the single-wire coupling block 1; an output port of the single-wire coupling block 1 is connected to an input port of the buffer BUF3 and an input port of the buffer BUF4; another input port of the single-wire coupling block 1 is connected to an output port of the buffer BUF1; an output port of the buffer BUF3 is connected to an input port of the Mixer1; an output port of the buffer BUF4 is connected to an input port of the mixer Mixer2; an output port of the mixer Mixer1 is connected to input ports of the drivers GM1 and GM7; an output port of the mixer Mixer2 is connected to input ports of the drivers GM2 and GM8; output ports of the drivers GM7 and GM8 are connected to a control port of the single-wire coupling block 1 and tan input port of the low-pass filter LPF3; another input port of mixer Mixer1 and another input port of the mixer Mixer2 are connected to an output port of the 4-divider, an input port of the buffer BUF1 and an input port of the buffer BUF2, and an input port of the mixer Mixer3 and an input port of the mixer Mixer4; an input port of the 4-divider is connected to an output port of the injection locked 2-divider; an input port of the injection locked 2-divider is connected to an output port of the LC VCO oscillator; an input port of the LC VCO oscillator is connected to output ports of the drivers GM1, GM2, GM3 and GM4 and an input port of the low-pass filter LPF1; another input port of Mixer3 is connected to an output port of buffer BUF5; another input port of the mixer Mixer4 is connected to an output port of the buffer BUF6; an output port of the mixer Mixer3 is connected to input ports of the drivers GM3 and GM5; an output port of the mixer Mixer4 is connected to input ports of the drivers GM4 and GM6; input ports of the buffers BUF5 and BUF6 are connected to an output port of single-wire coupling block 2; output ports of the drivers GM5 and GM6 are connected to an input port of the low-pass filter LPF2 and a control port of the single-wire coupling block 2; an input port of the single-wire coupling block 2 is connected to an output port of the buffer BUF2; and another input port of the single-wire coupling block 2 is connected to the transmission wire at another port of the PLL.

Furthermore, interconnection between the dual-input PLLs adopts the transmission wire of a lumped unit ladder network based on a left-handed material, and the network cascades LC units the same as an infinitesimal circuit model, and has a transmission coefficient as illustrated in the following formula under a lossless condition:

$$\beta(\omega) = -\frac{1}{\omega\sqrt{LC}}$$

where C is a capacitance value per unit length of the transmission wire, L is an inductance value per unit length of the transmission wire, and w is a signal angular velocity of the transmission wire.

The present disclosure has the following beneficial effects.

According to the on-chip synchronous self-repairing system, strict synchronization of each radio frequency transceiver chip in the array element tile can be realized under the influence of any environment, and the system has a small area, low losses and strong self-adaptability.

According to the present disclosure, a transmission wire based on an adjustable left-handed material is adopted as a delay wire, and because the left-handed transmission wire can generate an advanced phase, the positive time delay can be compensated in single-tone transmission. In addition, a capacitor-inductor lumped unit ladder network is adopted at a low frequency, thereby realizing synchronization compensation with only a short transmission wire, with a low loss and a short physical distance.

BRIEF DESCRIPTION OF DRAWINGS

FIG. 1a is a stellate coupled structure of a dual-input PLL, and FIG. 1b is a butterfly-shaped coupled structure of a dual-input PLL;

DESCRIPTION OF EMBODIMENTS

The purpose and effect of the present disclosure will become clearer by describing the present disclosure in detail according to the attached drawings and preferred embodiments. It should be understood that the specific embodiments described herein are only used to explain the present disclosure, and are not used to limit the present disclosure.

An on-chip synchronous self-repairing system based on a low-frequency reference signal adopts a dual-input PLL stellate coupled structure or a dual-input PLL butterfly-shaped coupled structure, and PLLs are coupled with each other via a single wire; the dual-input PLL stellate coupled structure connects n dual-input PLLs through chain closure, which mutually transmit one quarter of local oscillator signals for interlocking to achieve synchronization of the on-chip local oscillator signal; the dual-input PLL butterfly-shaped coupled structure connects m dual-input PLLs by lumping, and the local oscillator signals on each IC chip in a chip are synchronized by given reference signals; where, $n \geq 3$ and $m \geq 3$, and a transmission wire based on a left-handed material is used for interconnection between the PLLs.

Figure 1:
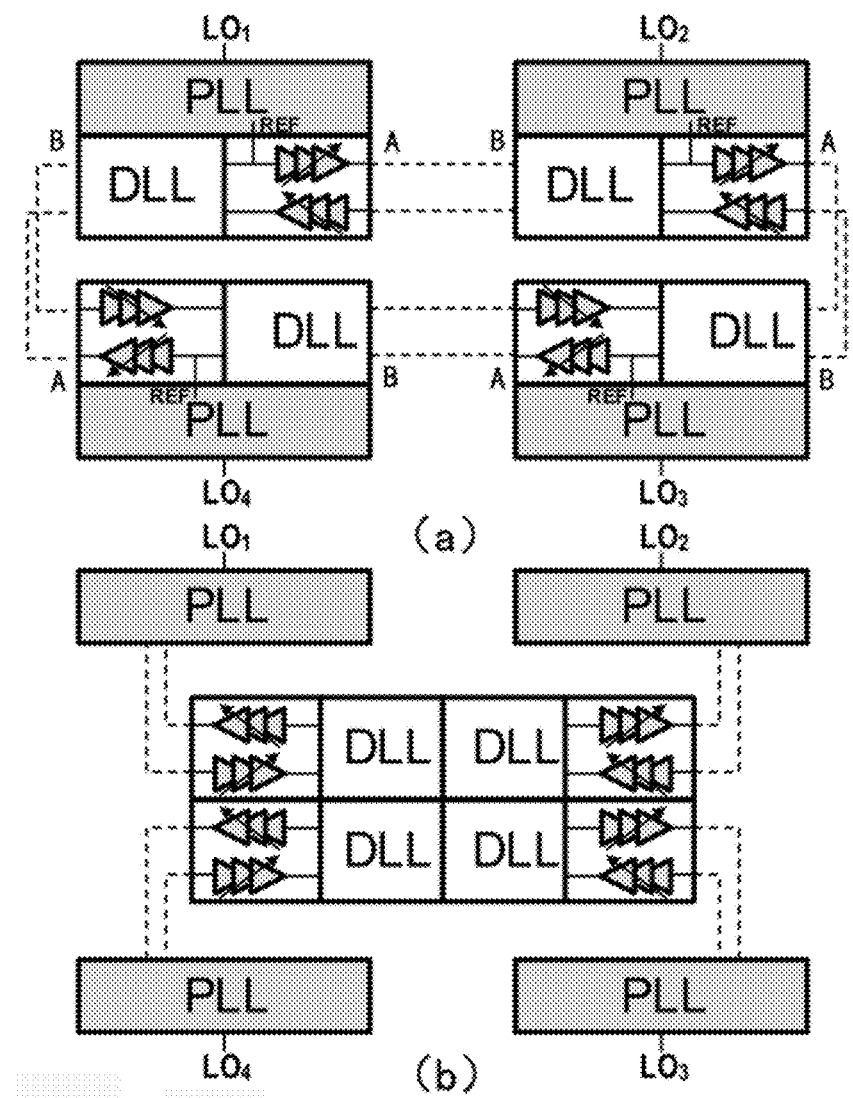
FIG. 1 is a structural schematic diagram of an on-chip synchronous self-repairing system in an array element tile based on a low-frequency reference signal.

In this embodiment, there are four dual-input PLLs in the dual-input PLL stellate coupled structure or the dual-input PLL butterfly-shaped coupled structure. As shown in FIG. 1, FIG. 1(a) is a dual-input PLL stellate coupled structure, which consists of dual-input PLL1, PLL2, PLL3 and PLL4, all of which are in their own IC chips, and the port A of the dual-input PLL1 is connected to the port B of the dual-input PLL2. The port A of the dual-input PLL2 is connected to the port B of the dual-input PLL3, and the port A of the dual-input PLL4 is connected to the port B of the dual-input PLL1 to form a closed loop, and the wires connected between PLLs can achieve bidirectional transmission. Each chip transmits a quarter of the local oscillator signals to interlock, and the local oscillator signals and the reference signals are synchronized by the phase-locked loop to ensure the phase synchronization of each IC chip on the chip.

FIG. 1(b) is a dual-input PLL butterfly-shaped coupled structure, which is composed of dual-input PLL1, PLL2, PLL3 and PLL4, in which PLLs and LO modules are all in their respective IC chips, while DLL modules are all outside the IC chip. The dual-input PLL1 is connected to the DLL modules of the dual-input PLL2, PLL3 and PLL4, gives a reference signal is given, and is connected to the corresponding PLL module through a DLL. The transmission wire can achieve bidirectional transmission.

Figure 2:
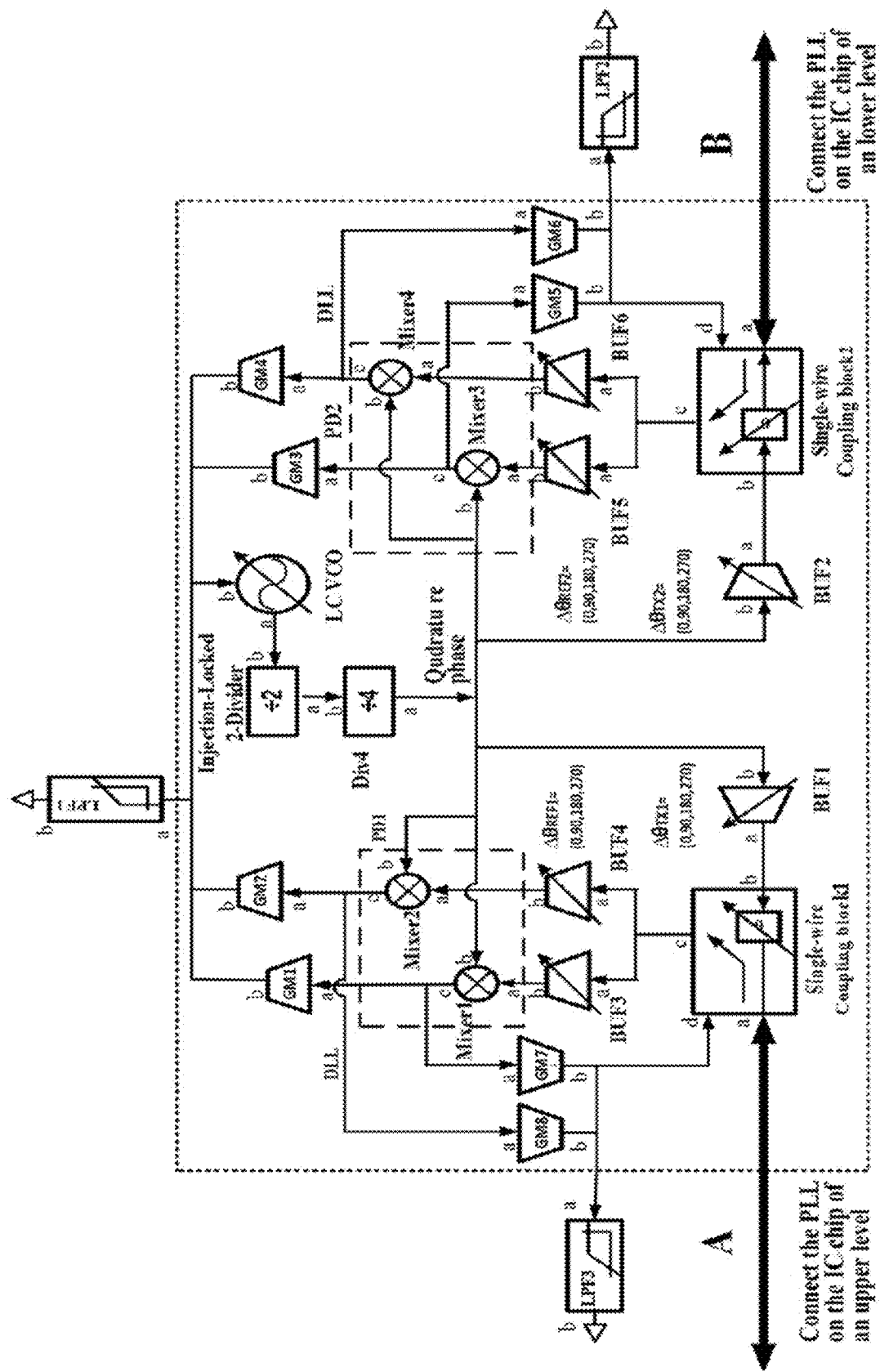
FIG. 2 is a schematic structural diagram of a dual-input PLL.

FIG. 2 is a schematic diagram of the dual-input PLL used in the coupled structure. The dual-input PLL consists of a LC VCO oscillator; an Injection-Locked 2-Divider; a 4-divider Div4; a Single-wire coupling block1 and a Single-wire coupling block2; phase detectors PD1 and PD2; drivers GM1, GM2, GM3, GM4, GM5, GM6, GM7 and GM8; buffers BUF1, BUF2, BUF3, BUF4, BUF5 and BUF6 and low-pass filters LPF1, LPF2 and LPF3. The phase detector PD1 is composed of mixers Mixer1 and Mixer2, and the phase detector PD2 is composed of mixers Mixer3 and Mixer4.

The connection mode of the dual-input PLL is shown in FIG. 2: the transmission wire at the port A is connected to the port a of the single-wire coupling block1; the port c of the single-wire coupling block1 is connected to the port a of the buffer BUF3 and an the port a of the buffer BUF4; the port b of the single-wire coupling block1 is connected to the port a of the buffer BUF1; the port d of the single-wire coupling block1 is connected to the port b of the driver GM7, the port b of the driver GM8 and the port a of the low-pass filter LPF3; the port b of the buffer BUF3 is connected to the port a of the mixer Mixer1; the port b of the buffer BUF4 is connected to the port a of the mixer Mixer2;

the port c of the mixer Mixer1 is connected to the port a of the driver GM1 and the port a of the driver GM7; the port c of the mixer Mixer2 is connected to the port a of the driver GM2 and the port a of the driver GM8; the ports b of the mixers Mixer1 and Mixer2 are connected to the port a of the 4-divider Div4, the ports b of the buffer BUF1 and BUF2, the ports b of the mixers Mixer3 Mixer4; the port b of the 4-divider Div4 is connected to the port a of the Injection-Locked 2-Divider; the port b of the Injection-Locked 2-Divider is connected to port a of the LC VCO oscillator; the port b of the LC VCO oscillator is connected to the port b of the driver GM1, the port b of the driver GM2, the port b of the driver GM3, the port b of the driver GM4 and the port a of the low-pass filter LPF1; the port c of the mixer Mixer3 is connected to the port a of the driver GM3 and the port a of the driver GM5; the port c of the mixer Mixer4 is connected to the port a of the driver GM4 and the port a of the driver GM6; the port a of the mixer Mixer3 is connected to the port b of the buffer BUF5; the port a of the mixer Mixer4 is connected to the port b of the buffer BUF6; the ports a of the buffer BUF5 and buffer BUF6 are connected to the port c of single-wire coupling block2; the port b of the single-wire coupling block2 is connected to the port a of the buffer BUF2; the port a of the single-wire coupling block2 is connected to the transmission wire at the port B; the port d of the single-wire coupling block2 is connected to the port b of the driver GM5, the port b of the driver GM6 and the port a of the low-pass filter LPF2.

The working principle of the dual-input PLL described above is that the LO chain is composed of LC-VCOs, which can drive the injection-locked 2-divider with an adjustable low power frequency, and then generate signals through the 4-divider Div4 and drive the phase detectors PD1 and PD2 and the output buffers BUF1 and BUF2 matched to 50Ω. Two-way coupling is achieved through the output buffer in the dual-input PLL, and the VCO signal and the reference signal at each common IO port are distinguished at the same time. By introducing an adjustable phase shift larger than 2π between the output driver (BUF1$_K$ or BUF2$_K$) in PLL$_K$ and the input end of phase detector (PD2$_{K-1}$ or PD1$_{K+1}$) in the adjacent PLL, the interconnection phase shift can be adjusted to achieve a low static phase offset between the phase detector inputs. Any orthogonal phase is selected from CML frequency divider through output buffers BUF1 and BUF2 to achieve coarse adjustment on the phase shift by about 90 degree, and the variable capacitance in an IO coupling module is controlled through the DLL module to achieve variable phase shift to compensate the phase shift generated on the transmission wire connected between PLLs, thereby achieving fine adjustment to ensure the quadrature phase difference between input signals of the phase detectors PD1 and PD2.

Figure 3:
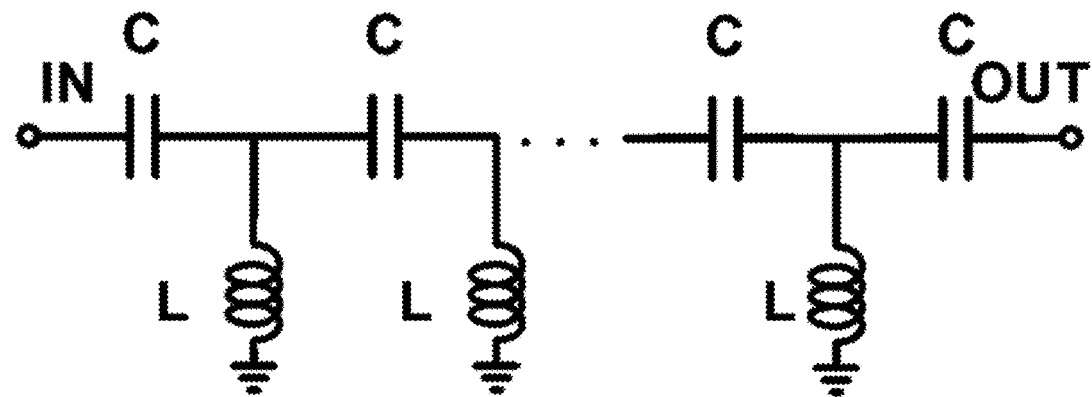
FIG. 3 is an equivalent circuit diagram of an artificial transmission wire based on a left-handed material.

FIG. 3 is an equivalent circuit diagram of a transmission wire based on AN adjustable left-handed material for connection between PLLs. The interconnection between the dual-input PLLs adopts the transmission wire of a lumped unit ladder network based on a left-handed material, and the network cascades LC units as shown in FIG. 3, the immittance value per unit length is very small. The network has a transmission coefficient as shown in the following formula under lossless conditions $$\beta(\omega) = -\frac{1}{\omega\sqrt{LC}}$$

where C is a capacitance value per unit length of the transmission wire, L is an inductance value per unit length of the transmission wire, and ω is a signal angular velocity of the transmission wire.

Figure 4:
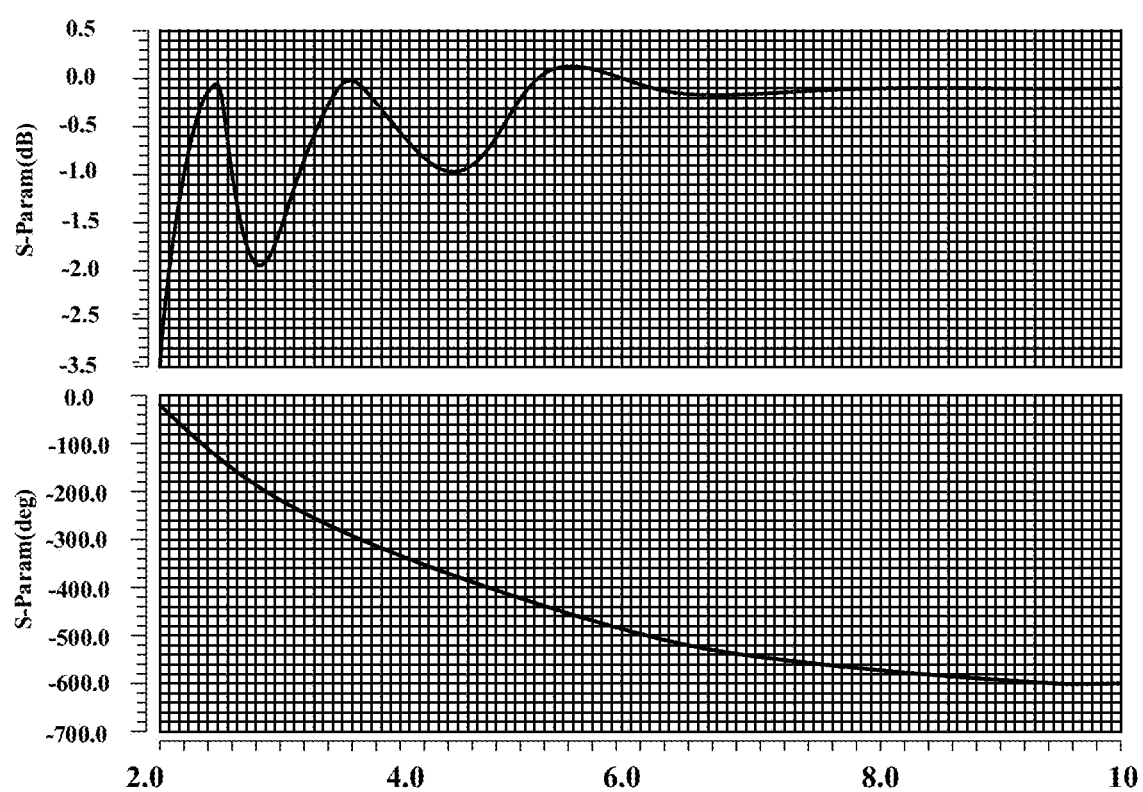
FIG. 4 is a schematic diagram of the simulation results of the phase of the left-handed transmission wire.

FIG. 4 is a schematic diagram of the simulation results of the transmission wire of the left-handed material. Because the left-handed transmission wire can produce an advanced phase, it can compensate for a positive time delay in single-tone transmission. At a low frequency, a capacitor-inductor lumped unit ladder network is used, which only needs short transmission wires to complete synchronization compensation, so that transmission wire loss is low and the physical distance is short. Then, a delay phase-locked loop is used to ensure that the reference signal has the same phase in each RF transceiver chip, thus automatically repairing the asynchronous phenomenon caused by environmental changes.

Those skilled in the art can understand that the above is only a preferred example of the present disclosure, and is not used to limit the present disclosure. Although the present disclosure has been described in details with reference to the aforementioned examples, for those skilled in the art, they can still modify the technical solutions described in the aforementioned examples, or replace some of the technical features equivalently. All modifications and equivalent substitutions within the spirit and principles of the present disclosure shall be within a protection scope of the present disclosure.

What is claimed is:

1. An on-chip synchronous self-repairing system based on a low-frequency reference signal for synchronization of local oscillator signals of multiple integrated circuit (IC) chips, wherein the system adopts a dual-input Phase-Locked Loop (PLL) stellate coupled structure, and dual-input PLLs of the dual-input Phase-Locked Loop (PLL) stellate coupled structure are coupled with each other via a respective Delay-Locked Loop (DLL) controlled phase adjustable left-handed material delay line, and the DLL controls the left-handed material delay line to achieve the desired phase or delay; the dual-input PLL stellate coupled structure connects n dual-input PLLs with n DLL controlled phase adjustable left-handed material delay lines through chain closure, which mutually transmit low-frequency reference signals, with coherence between the mutually transmitted low-frequency reference signals achieved by the DLL controlled phase adjustable left-handed material delay lines for interlocking to achieve synchronization of on-chip local oscillator signals; wherein the frequency of the low-frequency reference signal transmitted to each of the n dual-input PPLs is ¼ of the frequency of the local oscillator signal of the connected dual-input PLLs, wherein each DLL sends a low frequency output signal to another DLL and receives one low frequency input signal from the same DLL, subsequently the DLL controls its phase adjustable left-handed material delay line to achieve coherence between its input signal and its output signal; the local oscillator signals of the multiple IC chips are first synchronized in frequency by the low-frequency reference signal through the dual-input PLL stellate coupled structure which connects n dual-input PLLs, and the DLL controlled phase adjustable left-handed material delay lines are used to achieve phase synchronization subsequently; where n≥3.

2. The on-chip synchronous self-repairing system based on. a low-frequency reference signal according to claim 1, wherein the dual-input PLL stellate coupled structure has one of n dual-input PLLs in each of the multiple IC chips, and each IC chip is sequentially interconnected through a common Input-Output (IO) port. and an interconnection phase shift generated by the left-handed material delay line is controlled by a Delay-Locked Loop (DLL)-circuit; wherein the DLL-circuit consists of a voltage-controlled left-handed material delay line (VCDL), a phase detector (PD), a charge pump (CP) and a loop filter (LF); and the dual-input PLL stellate coupled structure is constructed such that:

a common IO port of a first dual-input PLL1 is connected to a common IO port of a second dual-input PLL2 through an interconnection phase shift generated by the left-handed material delay line, another common IO port of the second dual-input PLL2 is connected to a common IO port of a third dual-input PLL3 through an interconnection phase shift generated by the left-handed material delay line, another common IO port of the third dual-input PLL3 is connected to a common IO port of a fourth dual-input PLL4 through an interconnection phase shift generated by the left-handed material delay line; a common IO port of a n-$1^{th}$ dual-input PLLn−1 is connected to a common IO port of a n$^{th}$ dual-input PLLn through an interconnection phase shift generated by the left-handed material delay line, and another common IO port of the n$^{th}$ dual-input PLLn is connected to another common IO port of the first dual-input PLL1 through an interconnection phase shift generated by the left-handed material delay line, so as to form a closed loop.

3. The on-chip synchronous self-repairing system based on a low-frequency reference signal according to claim 2, wherein a dual-input PLL of the n dual-input PLLs or the m dual-input PLLs comprises an LC Voltage Controlled Oscillator (VCO), an injection locked 2-divider, a 4-divider, a single-wire coupling block 1 and a single-wire coupling block 2; phase detectors PD1 and PD2;

drivers GM1, GM2, GM3, GM4, GM5, GM6, GM7 and GM8; buffers BUF1, BUF2, BUF3, BUF4, BUF5 and BUF6, and low-pass filters LPF1, LPF2 and LPF3, wherein the phase detector PD1 comprises mixers Mixer1 and Mixer2, and the phase detector PD2 comprises mixers Mixer3 and Mixer4;

the dual-input PLL is connected in such a manner that: the DLL controlled phase adjustable left-handed material delay line connected to port of the PLL is connected to an input port of the single-wire coupling block 1; an output port of the single-wire coupling block 1 is connected to an input port of the buffer BUF3 and an input port of the buffer BUF4; another input port of the single-wire coupling block 1 is connected to an output port of the buffer BUF1; an output port of the buffer BUF3 is connected to an input port of the Mixer1; an output port of the buffer BUF4 is connected to an input port of the mixer Mixer2; an output port of the mixer Mixer1 is connected to input ports of the drivers GM1 and GM7; an output port of the mixer Mixer2 is connected to input ports of the drivers GM2 and GM8; output ports of the drivers GM7 and GM8 are connected to a control port of the single-wire coupling block 1 and an input port of the low-pass filter LPF3; another input port of mixer Mixer1 and another input port of the mixer Mixer2 are connected to an output port of the 4-divider, an input port of the buffer BUF1 and an input port of the buffer BUF2, and an input port of the mixer Mixer3 and an input port of the mixer Mixer4; an input port of the 4-divider is connected to an output port of the injection locked 2-divider;

an input port of the injection locked 2-divider is connected to an output port of the LC VCO oscillator; an input port of the LC VCO oscillator is connected to output ports of the drivers GM1, GM2, GM3 and GM4 and an input port of the low-pass filter LPF1;

another input port of Mixer3 is connected to an output port of buffer BUF5; another input port of the mixer Mixer4 is connected to an output port of the buffer BUF6; an output port of the mixer Mixer3 is connected to input ports of the drivers GM3 and GM5; an output port of the mixer Mixer4 is connected to input ports of the drivers GM4 and GM6; input ports of the buffers BUF5 and BUF6 are connected to an output port of single-wire coupling block 2; output ports of the drivers GM5 and GM6 are connected to an input port of the low-pass filter LPF2 and a control port of the single-wire coupling block 2; an input port of the single-wire coupling block 2 is connected to an output port of the buffer BUF2; and another input port of the single-wire coupling block 2 is connected to the transmission wire at another port of the PLL.

4. The on-chip synchronous self-repairing system based on a low-frequency reference signal according to claim 2, wherein the interconnection between the dual-input PLLs based on the DLL controlled phase adjustable left-handed material delay lines adopts the transmission wire of a lumped unit ladder network based on a lefthanded material, and the network cascades LC units the same as an infinitesimal circuit model and has a transmission coefficient as illustrated in the following formula under a lossless condition:

$$\beta(\omega) = -\frac{1}{\omega\sqrt{LC}}$$

where C is a capacitance value per unit length of the transmission wire, L is an inductance value per unit length of the transmission wire, and ω is a signal angular velocity of the transmission wire.

* * * * *